(12) United States Patent
Smith et al.

(10) Patent No.: US 8,738,979 B2
(45) Date of Patent: May 27, 2014

(54) METHODS AND STRUCTURE FOR CORRELATION OF TEST SIGNALS ROUTED USING DIFFERENT SIGNALING PATHWAYS

(75) Inventors: Paul J. Smith, Colorado Springs, CO (US); Jeffrey K. Whitt, Colorado Springs, CO (US); Eugene Saghi, Colorado Springs, CO (US); Douglas J. Saxon, Colorado Springs, CO (US); Joshua P. Sinykin, Shrewsbury, MA (US)

(73) Assignee: LSI Corporation, Milpitas, CA (US)

( * ) Notice: Subject to any disclaimer, the term of this patent is extended or adjusted under 35 U.S.C. 154(b) by 158 days.

(21) Appl. No.: 13/434,962

(22) Filed: Mar. 30, 2012

(65) Prior Publication Data
US 2013/0262946 A1    Oct. 3, 2013

(51) Int. Cl.
G01R 31/28    (2006.01)
G01R 31/319    (2006.01)
G01R 31/317    (2006.01)

(52) U.S. Cl.
CPC .... *G01R 31/31922* (2013.01); *G01R 31/31727* (2013.01); *G01R 31/31915* (2013.01)
USPC .......................................... 714/744; 714/734

(58) Field of Classification Search
None
See application file for complete search history.

(56) References Cited

U.S. PATENT DOCUMENTS

| | | | |
|---|---|---|---|
| 4,364,036 A * | 12/1982 | Shimizu ........................ | 345/618 |
| 5,317,711 A * | 5/1994 | Bourekas et al. ............ | 714/47.1 |
| 5,936,977 A * | 8/1999 | Churchill et al. ............... | 714/26 |
| 5,951,696 A | 9/1999 | Naaseh et al. | |
| 6,370,663 B1 * | 4/2002 | Kudo ............................. | 714/724 |
| 6,397,354 B1 | 5/2002 | Ertekin | |
| 6,430,696 B1 * | 8/2002 | Keeth ............................ | 713/503 |
| 6,943,610 B2 | 9/2005 | Saint-Laurent | |
| 7,055,117 B2 | 5/2006 | Yee | |
| 7,263,646 B2 | 8/2007 | Glenn et al. | |
| 7,401,246 B2 | 7/2008 | Martin et al. | |
| 7,496,474 B2 * | 2/2009 | Browen et al. ................ | 702/183 |
| 7,689,879 B2 * | 3/2010 | Jeddeloh ....................... | 714/718 |
| 7,733,112 B2 * | 6/2010 | Kishimoto et al. ...... | 324/762.01 |
| 7,750,665 B2 * | 7/2010 | Miyazaki et al. ............... | 326/16 |
| 7,900,108 B2 | 3/2011 | Pugliesi-Conti et al. | |
| 7,940,066 B2 * | 5/2011 | Jarboe, Jr. et al. ......... | 324/750.3 |
| 7,944,234 B2 * | 5/2011 | Lunzer et al. ................... | 326/38 |
| 7,990,783 B1 * | 8/2011 | Clarke et al. .................. | 365/193 |
| 8,103,917 B2 * | 1/2012 | Jang .............................. | 714/700 |
| 8,356,214 B2 * | 1/2013 | Do ................................. | 714/718 |
| 2005/0044460 A1 | 2/2005 | Hoglund et al. | |
| 2005/0289418 A1 * | 12/2005 | Agarwal ....................... | 714/726 |
| 2007/0112544 A1 * | 5/2007 | Browen et al. ................ | 702/183 |
| 2008/0052574 A1 * | 2/2008 | Smith et al. ................... | 714/724 |
| 2010/0268906 A1 | 10/2010 | Gillingham et al. | |

(Continued)

*Primary Examiner* — Daniel McMahon
(74) *Attorney, Agent, or Firm* — Duft Bornsen & Fettig

(57) ABSTRACT

Methods and structure for correlating internal operational signals routed via different paths of a test signal selection hierarchy. The structure includes a functional block of circuitry operable to generate internal operational signals and clock signals. The integrated circuit also comprises a test signal selection hierarchy operable to receive the internal operational signals and the clock signals and to selectively route the internal operational signals and the clock signals. Further, structure includes a control unit operable to receive the clock signals from the test signal selection hierarchy, to determine a delay between received clock signals routed via different signaling pathways of the test signal selection hierarchy. The control unit is further operable to program a delay line based upon the delay between the clock signals and based upon internal operational signals correlated with the clock signals.

20 Claims, 3 Drawing Sheets

(56) References Cited

U.S. PATENT DOCUMENTS

2011/0131351 A1* 6/2011 Noeldner et al. ............... 710/52
2011/0215833 A1* 9/2011 Lunzer et al. .................. 326/39
2011/0289180 A1* 11/2011 Sonnier et al. ............... 709/213

* cited by examiner

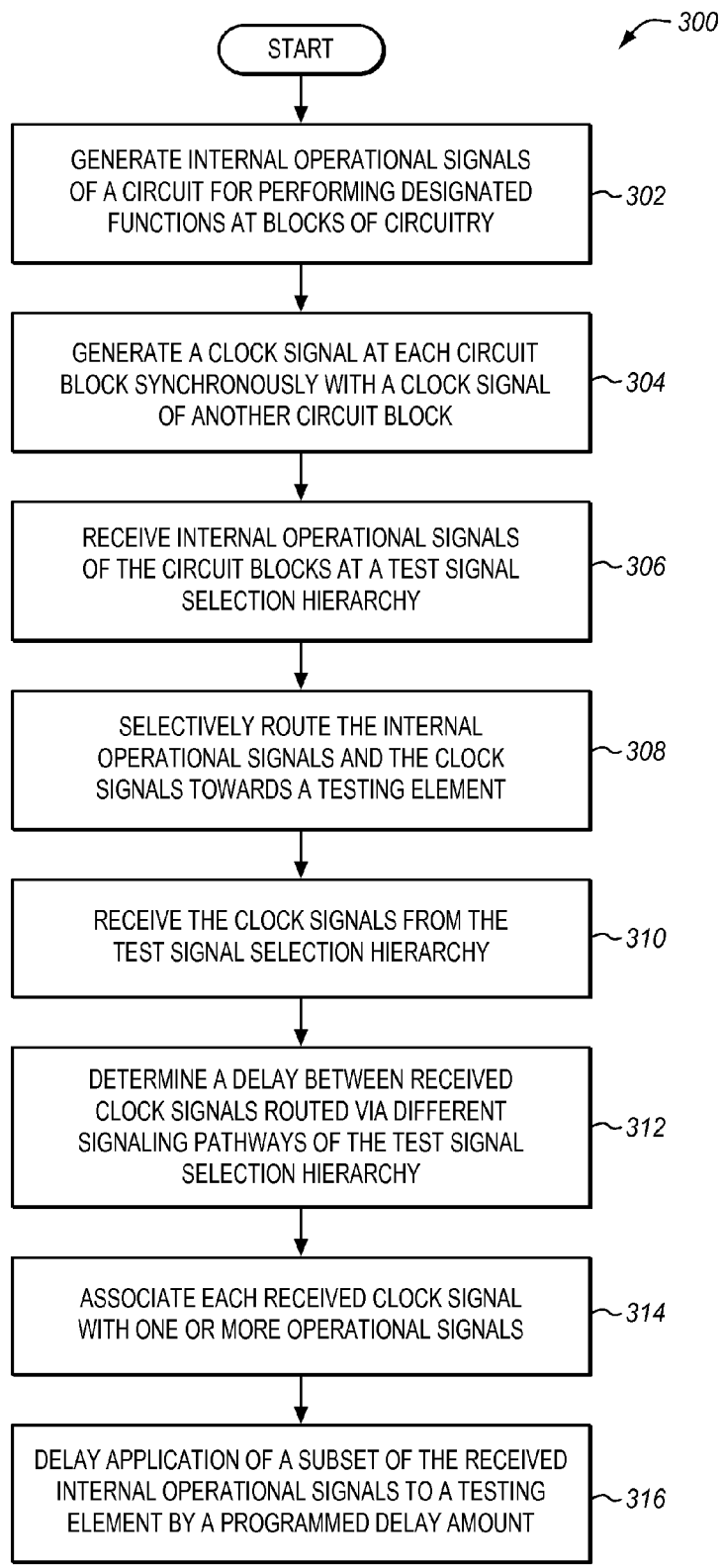

METHODS AND STRUCTURE FOR CORRELATION OF TEST SIGNALS ROUTED USING DIFFERENT SIGNALING PATHWAYS

BACKGROUND

1. Field of the Invention

The invention relates generally to integrated circuits and more specifically relates to correlating test signals acquired from multiple circuitry blocks of an integrated circuit.

2. Related Patents

This patent is related to commonly owned U.S. patent application Ser. No. 13/434,940 entitled "METHODS AND STRUCTURE FOR CORRELATING MULTIPLE TEST OUTPUTS OF AN INTEGRATED CIRCUIT ACQUIRED DURING SEPARATE INSTANCES OF AN EVENT" which is hereby incorporated by reference.

3. Discussion of Related Art

Electronic circuits perform a wide variety of designated functions for electronic systems. For example, integrated circuits may be used for data processing, data storage and retrieval, system analysis and control, and many other functions. Integrated circuits may be subject to programming, design, or operational errors, and internal operational signals are not exposed for acquisition by external devices during normal operation (i.e., they are internal to the circuit). It would be impractical or impossible to connect every internal operational signal to its own dedicated output pin of the circuit for monitoring purposes. As such, it is desirable not only to include logic in the circuit that performs the circuit's desired function, but also to include logic and components at the circuit for acquiring selected internal signals for debugging and testing purposes (e.g., for externally monitoring internal operational signals of the circuit). For example, the circuit may include test multiplexers (MUXs) having registers that can be programmed to select internal operational signals for routing through the test MUXs. The test MUXs provide the selected internal operational signals as test outputs (e.g., specialized debug outputs) for the circuit. Utilizing MUXs to output test signals that are normally internal to the circuit ensures that the cost and size of a circuit implementing testing logic is reduced, because MUXs allow a large number of internal signaling pathways to be condensed into a much smaller number of output signal paths. These output paths may be monitored by a logic analyzer so as to acquire the selected internal operational signals.

Unfortunately, utilizing a test signal selection hierarchy for routing internal operational signals to an output results in a number of problems. For example, because routing elements for the circuit may be located in physically distant locations from each other within the integrated circuit die, each routing path to a final output varies in length, the number of routing components, and the type of routing components. Thus, signaling pathways used to route internal operational signals from each circuitry block may be associated with a different routing delay. This causes a substantial problem when attempting to analyze received signals, as signals that were generated at the same time in different circuit blocks (or even in the same circuit block) may appear to be asynchronous as-received at the final output. In the field of circuit testing, it may be critical to measure the exact response of an internal operational signal to a stimulus. Thus, even relatively small delays between received signals may alter the way that the data is interpreted, causing a designer to misdiagnose problems at the circuit.

Thus it is an ongoing challenge to acquire internal operational signals for use in testing a circuit without altering the timing of those signals with respect to each other.

SUMMARY

The present invention addresses the above and other problems, thereby advancing the state of the useful arts, by providing methods and structure for including a clock signal along with signals selected for routing via a test signal routing hierarchy. A synchronized clock signal is sent along the signaling pathways of the test signal routing hierarchy, so that the differential transmission delay between each pathway can be determined Once the differential delay has been calculated, selected signals from the blocks can be correlated in time to account for the varying delays in the signaling pathways of the test signal routing hierarchy.

One embodiment is an integrated circuit. The integrated circuit comprises a functional block of circuitry operable to generate internal operational signals for performing designated functions, the block of circuitry comprising a test clock operable to generate clock signals. The integrated circuit also comprises a test signal selection hierarchy coupled with the block, the test signal selection hierarchy operable to receive the internal operational signals and the clock signals and to selectively route the internal operational signals and the clock signals toward a testing element. Further, the integrated circuit comprises a control unit operable to receive the clock signals from the test signal selection hierarchy, operable to determine a delay between received clock signals routed via different signaling pathways of the test signal selection hierarchy, and operable to associate each received clock signal with one or more internal operational signals. Also, the integrated circuit includes a delay line operable to receive internal operational signals from the test signal selection hierarchy and to delay application of a subset of the received internal operational signals to the testing element by a programmed delay amount. The control unit is further operable to program the delay line based upon the delay between the clock signals and based upon the subset of the received internal operational signals.

Another aspect hereof provides another integrated circuit. The integrated circuit comprises functional blocks of circuitry, each block operable to generate internal operational signals for performing designated functions, each block of circuitry comprising a test clock operable to generate a clock signal and operable to synchronize generation of the clock signal with a clock signal of a test clock of another circuit block. The integrated circuit further comprises a test signal selection hierarchy coupled with the blocks, the test signal selection hierarchy operable to receive the internal operational signals and the clock signals and to selectively route the internal operational signals and the clock signals to a testing element. Additionally, the integrated circuit includes a control unit operable to receive the clock signals from the test signal selection hierarchy, operable to determine a delay between received clock signals routed via different signaling pathways of the test signal selection hierarchy, and operable to associate each received clock signal with one or more internal operational signals. Furthermore, the integrated circuit includes a delay line operable to receive internal operational signals from the test signal selection hierarchy and to delay application of a subset of the received internal operational signals to the testing element by a programmed delay amount. The control unit is further operable to program the delay line based upon the delay between the clock signals and based upon the subset of the received internal operational signals.

Another embodiment is a method. The method comprises generating internal operational signals for performing designated functions at blocks of circuitry of an integrated circuit, and generating, at each circuit block, a clock signal synchronously with a clock signal of a test clock of another circuit block. The method further comprises receiving, via a test signal selection hierarchy, the internal operational signals and the clock signals, and selectively routing, via signaling pathways of the test signal selection hierarchy, the internal operational signals and the clock signals towards a testing element. The method also comprises receiving the clock signals from the test signal selection hierarchy, determining a delay between received clock signals routed via different signaling pathways, and associating each received clock signal with one or more internal operational signals. Further, the method includes delaying application of a subset of the received internal operational signals to a testing element by a programmed delay amount based upon the delay between the clock signals and based upon the subset of the received internal operational signals.

BRIEF DESCRIPTION OF THE DRAWINGS

FIG. 3 is a flowchart describing an exemplary method in accordance with features and aspects hereof to correlate internal operational signals routed to a test output via different signaling pathways.

DETAILED DESCRIPTION OF THE DRAWINGS

Figure 1:
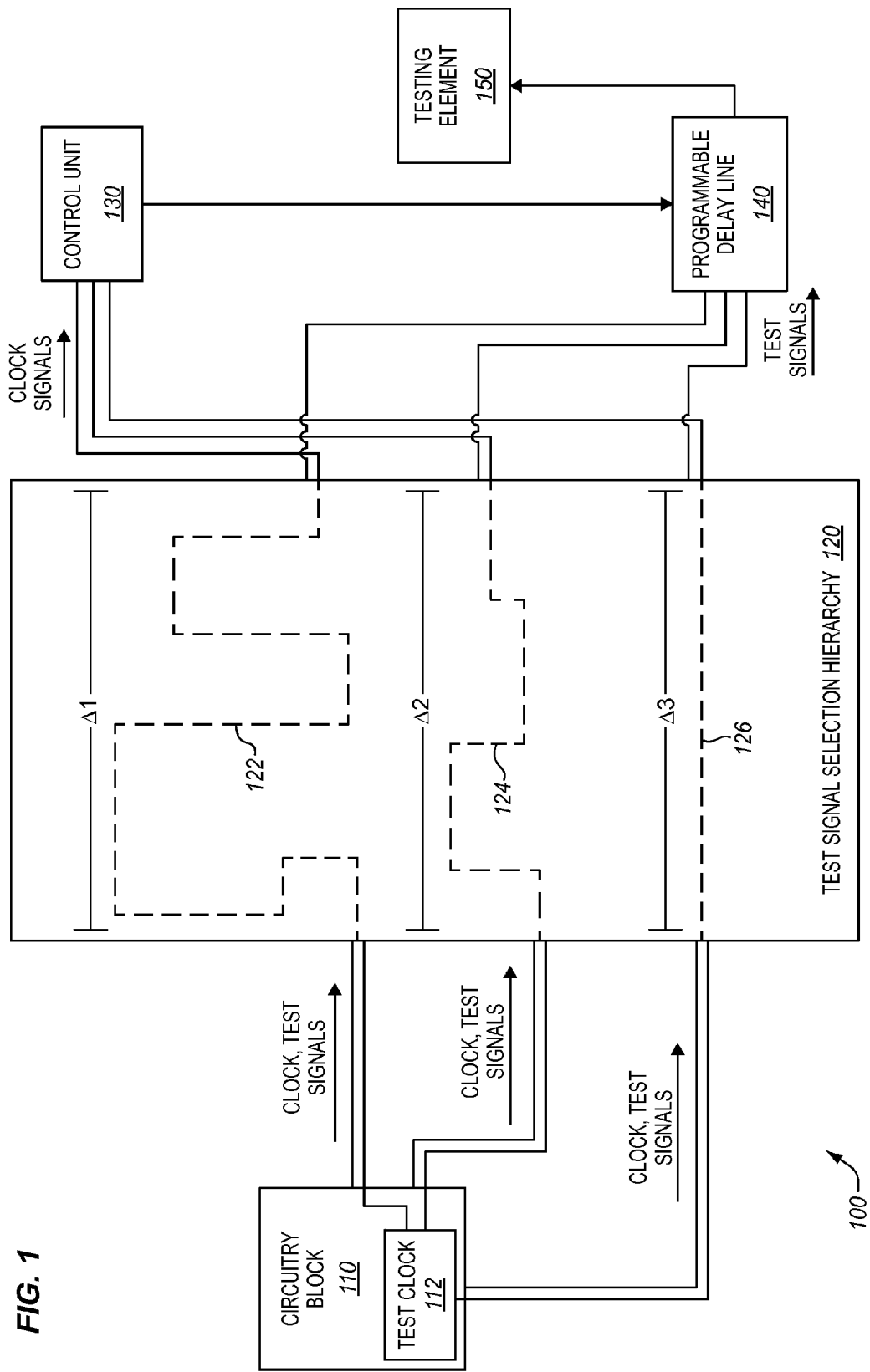
FIG. 1 is a block diagram of an exemplary integrated circuit in accordance with features and aspects hereof

FIG. 1 is a block diagram of an exemplary integrated circuit 100 in accordance with features and aspects hereof According to FIG. 1, integrated circuit 100 comprises circuitry block 110 and test clock 112, test signal selection hierarchy 120, control unit 130, programmable delay line 140, and testing element 150.

While in operation, circuitry block 110 is operable to generate a variety of internal operational signals pertaining to performing the functions it has been designed for. Circuitry block 110 is further operable to provide various internal operational signals (test signals) to test signal selection hierarchy 120. Accompanying the signals provided to test signal selection hierarchy 120 are test clock signals generated by test clock 112. A test clock signal is provided along each different signaling pathway (herein, represented by reference numbers 122, 124, and 126) of test signal selection hierarchy 120.

Each signaling pathway may have a different physical length, a different number of routing elements (not shown), and a different type of routing elements (not shown). Thus, internal operational signals routed along each signaling pathway are subject to different amounts of delay (herein indicated as 41, 42, and 43). Control unit 130 is operable to receive the clock signals, and to determine the relative delays among the various signaling pathways. Based upon these known relative delays, control unit 130 is operable to program delay line 140. Delay line 140 delays signals routed through each signaling pathway, so that whatever internal operational signals are selected by test signal selection hierarchy 120, the signals are received at testing element 150 without notable relative delay with respect to each other. Thus, the internal operational signals as-received at testing element 150 are correlated in time in the same manner as they were correlated in time when originally generated.

Figure 2:
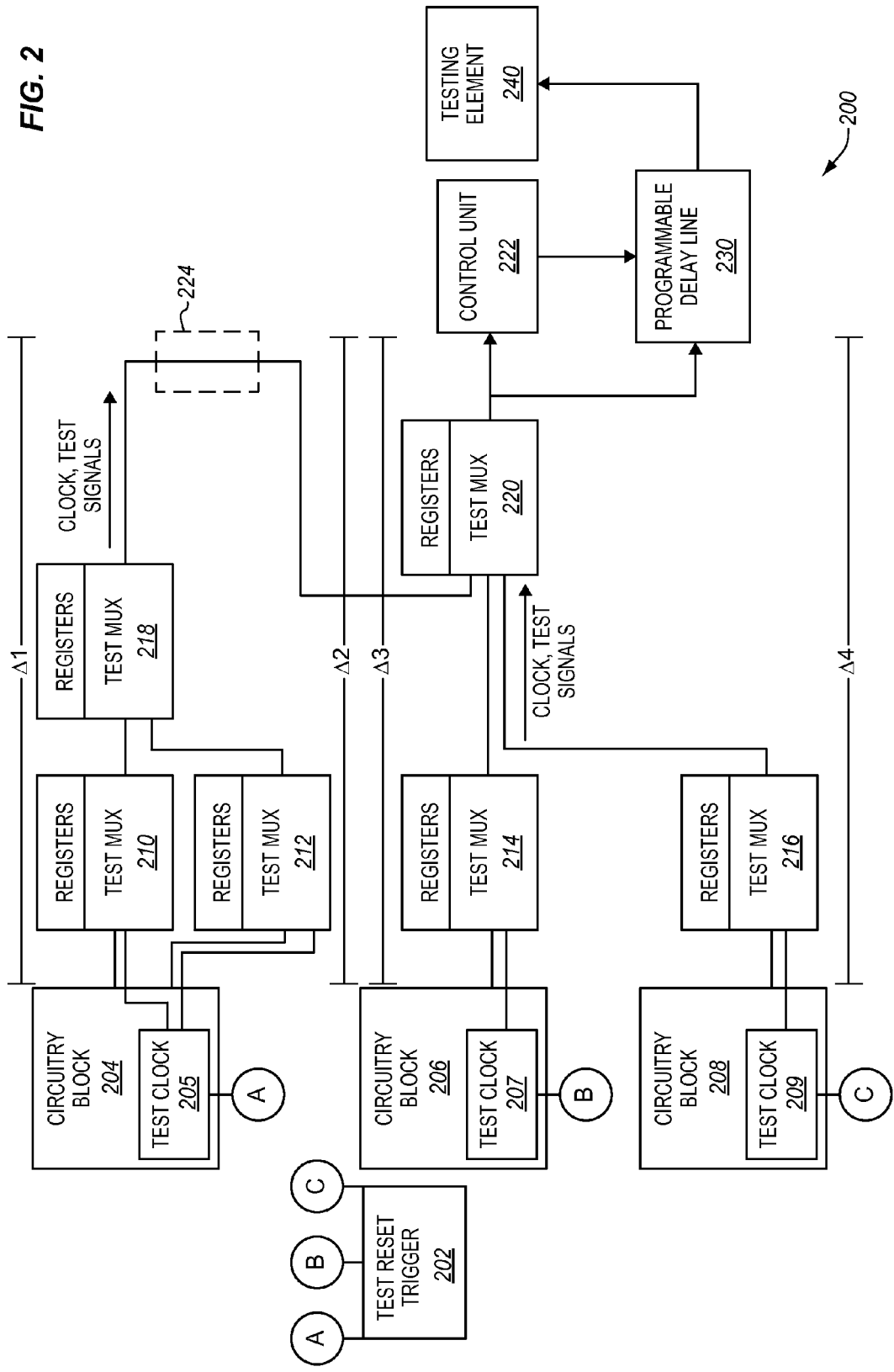
FIG. 2 is a block diagram of a further exemplary integrated circuit in accordance with features and aspects hereof

FIG. 2 is a block diagram of a further exemplary integrated circuit 200 in accordance with features and aspects hereof. Integrated circuit 200 includes features for synchronously applying selected internal operational signals to testing element 240 for monitoring. The selected internal operational signals may encounter different amounts of delay when routed through a test signal selection hierarchy, but one or more delay lines 230 are operable to compensate for the varying delay to ensure that the internal operational signals are applied to testing element 240 with reduced (e.g., minimal or no) differential delay. Thus, a designer testing integrated circuit 200 may view the selected internal operational signals together without worrying about encountering significant differential skew between the signals as applied to testing element 240.

Circuitry blocks 204, 206, and 208 comprise any systems or components of a circuit operable to generate electronic signals for use in performing a designated function. Integrated circuits can be used in the performance of a vast number of different functions. For example, the circuitry blocks may comprise electronic components implementing a System On a Chip (SOC) or a Redundant Array of Independent Disks On a Chip (ROC). In order to aid performance of these functions, the circuitry blocks may include operational timers, clocks, processors, signaling pathways, and other components. The number of circuitry blocks utilized by integrated circuit 200 will vary as a matter of design choice.

The various components of each circuitry block are implemented within integrated circuit 200 (e.g., the components may be implemented on a die for integrated circuit 200, and the physical die is typically encased in a package for physical interconnection with other circuits). As such, it will be generally understood that internal operational signals of the circuitry blocks are generally unavailable for acquisition external to the integrated circuit unless they are routed through a dedicated test output. During the performance of designated functions, the circuitry blocks generate internal operational signals. The actual number of internal signals generated by each circuitry block may vary as a matter of design choice. Selected internal operational signals of the circuitry blocks, which are not intended for external output (except via a test output used for debugging purposes), may be routed to testing element 240 via a test signal routing hierarchy.

In this embodiment, the test signal routing hierarchy comprises test multiplexers (MUXs) 210-220, which include test registers that may be programmed in order for the test MUXs to route selected signals towards testing element 240 for output (e.g., to a logic analyzer or external device). However, the test signal routing hierarchy may comprise any number and any arrangement of circuitry components operable to route signals to testing element 240 of integrated circuit 200. As discussed previously, a test signal routing hierarchy allows a designer of a circuit to test a portion of the internal operational signals of an integrated circuit. Typically, the test signal selection hierarchy will be unable to acquire all internal operational signals of an integrated circuit at once. Therefore, a circuit designer may test integrated circuit 200 multiple times in order to acquire a larger subset of internal operational signals that may be correlated in time.

If a designer wishes to test various signals of integrated circuit 100 in order to determine the response of integrated circuit 200 to a stimulus, the designer may program test MUXs and other components of the test signal routing hierarchy in order to acquire various internal operational signals.

However, because the test signal routing hierarchy includes multiple paths having different routing elements, and because signals traversing the test signal routing hierarchy travel different paths, each group of signals is potentially subject to a different level of skew/delay relative to other groups of signals selected for application to test element 240.

To illustrate this differential delay, the test signal selection hierarchy of FIG. 2 includes an exemplary number of different signal routing paths, each associated with a different delay (4). For example, the signaling pathway through test MUX 210 to test MUX 218 and test MUX 220 is associated with a first delay (41). The signaling pathway through test MUX 212 to test MUX 218 and test MUX 220 is associated with a second delay (42). Similarly, the signaling pathway through test MUX 214 to test MUX 220 is associated with a third delay (43), and the signaling pathway through test MUX 216 to MUX 220 is associated with a fourth delay (44). As the delays are not known a priori, signals selected from different circuitry blocks (or even the same circuitry block) may be applied to test MUX 220 skewed/delayed with respect to other selected signals that are applied to test MUX 220. This makes it harder for a designer of integrated circuit 200 to test the disparate selected signals, as their relationship to each other in time is likely to be unknown or inaccurate.

In order to address this issue, in this embodiment the designer may program each test MUX to acquire a test clock signal of a circuitry block. These clock signals may be routed via the test signal selection hierarchy in much the same way as the internal operational signals. For example, circuitry block 204 includes test clock 205, circuitry block 206 includes test clock 207, and circuitry block 208 includes test clock 209. In this manner, if signals from a circuitry block travel different paths, the delay of each path may be determined based upon the delay between the test clock signals. Thus, any skew encountered in routing the signals via the test signal selection hierarchy may be accounted for using one or more delay lines.

If the designer wishes to ensure that signals from different circuitry blocks can be adequately correlated in time with respect to some detected event, integrated circuit 200 may further include test reset trigger 202, which is operable, via clock routing tools such as clock trees, to trigger a clock reset synchronously at each of the test clocks of the circuitry blocks of integrated circuit 200. In general, test reset trigger 202 comprises logic that detects the desired event. This logic may comprise programmable features to allow flexibility by the design/test engineer in defining the event that will cause a reset of the test clocks. Further, test reset trigger 202 may comprise a well-known reset tree signal structure that compensates for the different fixed propagation delays between the reset signal generated by trigger 202 and as applied to each of the test clocks (205, 207, and 209). In this manner, because the test clocks are synchronous when they generate a clock signal, even signals from different circuitry blocks may be correlated in time by comparing the clock signals.

Control unit 222 comprises any circuit or component operable to receive test clock signals routed through the test signal selection hierarchy, and to determine a relative delay between each of the received test clock signals. This may be determined by calculating a time difference between rising edges of the test clock signals, falling edges of the clock signals, etc.

For example, control unit 222 may acquire a first clock signal from a first signaling pathway (e.g., test clock 205 received at control unit 222 through appropriate selections of text MUXs 210, 218, and 220), a second clock signal from a second signaling pathway (e.g., test clock 205 received at control unit 222 through appropriate selections of test MUXs 212, 218, and 220), and so on. Control unit 222 may then compare the time between the rising edge of each clock signal, selected sequentially, in order to determine relative delays between the test clock signals. The delay of each test clock signal relative to each other test clock signal is determined, and these determined delays correspond to the delay for the signaling pathways traveled by the test clock signals. Control unit 222 may thus store the determined delay of each signaling pathway in a memory (e.g., a register file), and may program delay line 230 to delay signals received from each signaling pathway in order account for the delay. Thus, when signals are acquired during testing of integrated circuit 200, the signals are correlated in time.

In one embodiment, control unit 222 utilizes many inputs, and each input corresponds to a single signaling pathway of the test signal selection hierarchy. Furthermore, integrated circuit 200 includes a delay line 230 for each signaling pathway. Thus, there is a one-to-one correspondence of inputs of control unit 222 to signaling pathways. Further, there is a one-to-one correspondence of signaling pathways to delay lines. As such, control unit 222 may program each delay line to account for the delay of an associated signaling pathway.

In another embodiment, the correspondence of inputs of control unit 222 to signaling pathways is determined based upon the way in which the test signal routing hierarchy is programmed Control unit 222 is therefore operable to determine which inputs relate to which signaling pathways based upon the current programming applied to the test signal routing hierarchy (i.e., based upon how the test signal selection hierarchy is programmed, control unit 222 may be able to determine that one of its inputs relates to a first signaling pathway instead of a second signaling pathway). Control unit 222 may then calculate the delay for each signaling pathway based on the received clock signals at each input, and may store these delays in a memory such as a content-addressable memory. Later, when test signals are acquired during operations of the circuit, control unit 222 may determine the signaling pathway used by each test signal, and may further program delay lines 230 to account for the delays of those signaling pathways.

Based upon the determined relative delays between signaling pathways, control unit 222 is operable to determine and apply a further delay (via delay lines 230) to received internal operational signals in order to correlate the internal operational signals in time (i.e., control unit 222 determines how to ensure that the internal operational signals are all delayed by the same amount of time when applied to testing element 240, regardless of the signaling pathway they used to get to testing element 240). Thus, the relative delay between selected internal operational signals may be accounted for by using the clock signals as a reference.

Depending upon the manner in which control unit 222 is implemented, control unit 222 may be duplicated, for example, at locations such as location 224 within the test signal selection hierarchy in order to de-skew internal operational signals multiple times within the test signal selection hierarchy. This may be particularly useful when multiple signaling pathways are condensed into a lesser number of signaling pathways at different tiers of the test signal selection hierarchy, and control unit 222 is not capable of associating a single input line with multiple signaling pathways.

Programmable delay lines 230 comprise any circuits or components operable to apply a delay to one or more internal operational signals selected for output to testing element 240. Delay lines 230 will typically include multiple individual delay lines, and will therefore be capable of applying a different programmed delay to each set of internal signals that has traveled through a different signaling pathway of the test signal routing hierarchy. Furthermore, delay lines 230 are programmed by control unit 222 in order to ensure that acquired internal operational signals are properly correlated in time and applied synchronously to testing element 240.

Testing element 240 may comprise any circuit or component operable to provide internal operational signals of integrated circuit 200 that are not typically provided during normal operation of integrated circuit in performing its designated functions. Testing element 240 may comprise, for example, a plurality of General Purpose Input/Output (GPIO) pins which may be communicably coupled to an external testing device (e.g., a logic analyzer). In another embodiment, testing element 140 may comprise an internal logic analyzer component of integrated circuit 200 for analysis of the selected internal operational signals applied thereto.

Thus, utilizing the various components of integrated circuit 200, test clock signals are routed via signaling pathways of the test signal selection hierarchy (the same signaling pathways used to route selected internal operational signals to testing element 240). The test clock signals so routed are then used to determine relative delays of the corresponding signaling pathways so that a programmable delay line may align signals from the various signaling pathways. This allows a user to correlate the timing of internal operational signals that have traveled across different signaling pathways of a test signal selection hierarchy in order to determine when those signals were actually generated at circuit blocks. Thus, integrated circuit 200 provides for substantially more effective monitoring of internal operational signals for debug and test purposes because there is no differential delay between internal operational signals as they are provided to testing element 240.

Note that the particular arrangement of components described herein is merely intended to be exemplary, and one of ordinary skill in the art will appreciate that the specific arrangement and configuration of integrated circuits is merely a matter of design choice.

FIG. 3 is a flowchart describing an exemplary method 300 in accordance with features and aspects hereof to correlate internal operational signals routed to a test output via different signaling pathways. The method of FIG. 3 may be operable in an integrated circuit such as described above with regard to FIGS. 1-2.

Step 302 comprises generating, at a circuitry block, internal operational signals of an integrated circuit that are used in performing designated functions of the circuit. These internal operational signals are generated during normal operations of the circuit (i.e., the signals are not generated during a dedicated testing mode for the circuit, but are rather generated in order to fulfill the circuit's intended purpose when used by a customer).

Step 304 comprises generating a test clock signal at each circuit block synchronously with a test clock signal of another circuit block. These clock signals may be synchronously triggered by the use of well-known clock signal designs (e.g., clock trees and/or reset trees to synchronously reset each of a plurality of test clock signal generators). Synchronizing the clock signals using a triggering event ensures that the delay for signaling pathways that route signals from functional circuitry blocks to a testing element can be determined Depending upon the nature of the triggering event, the synchronized clock signals may synchronously initiate a rising edge of a clock signal, a falling edge of a clock signal, etc. Additionally, each pulse of the clock signal will preferably take longer than the longest expected differential delay between the signaling pathways, for reasons that will be discussed below with regard to step 312.

Step 306 comprises receiving the selected internal operational signals of the circuit blocks at a test signal selection hierarchy. The test signal selection hierarchy may comprise any number of routing components and/or devices, combined in any fashion. It will be appreciated that the test signal selection hierarchy may include a number of levels, such that certain signaling pathways may overlap in-part, as depicted with regard to FIG. 1. Depending upon how the test signal selection hierarchy is programmed, different sets of internal operational signals may be acquired for use.

Step 308 comprises selectively routing the selected internal operational signals and the clock signals towards a testing element. The selective routing may be a function of how the test signal selection hierarchy is programmed Thus, the various combinations of register selections at test MUXs and/or other elements of the test signal selection hierarchy will determine which subsets of internal operational signals are to be applied to the testing element.

Step 310 comprises receiving the clock signals from the test signal selection hierarchy. These clock signals may be received, for example, at a control unit of the integrated circuit designed to determine the relative delay between various signaling pathways of the test signal selection hierarchy.

Step 312 comprises determining a delay between received clock signals routed via different signaling pathways. This may comprise, for example, determining the difference in time between rising edges of pulses of the clock signals, falling edges of pulses of the clock signals, etc. Thus, it may be desirable for the clock signals to have pulses that are longer than the longest expected delay between signaling pathways. Otherwise, if the delays are substantial, a rising edge of a first iteration of a clock pulse may be confused with a rising edge of another iteration of the clock pulse. The delay may be determined relative to other received clock signals, or may be determined relative to a clock signal that is directly passed to the control unit without traveling through the test signal routing hierarchy. In any case, the determined delays are enough to correlate the different clock signals in time.

Step 314 comprises associating each received clock signal with one or more internal operational signals. This may be accomplished when the test signal selection hierarchy is programmed For example, selecting specific internal operational signals (and associated clock signals) for application to the test signal selection hierarchy may also include programming a control unit of the integrated circuit with information describing which received clock signals correlate to which internal operational signals. Thus, groups of internal operational signals are correlated with clock signals that have a known delay relative to each other. In a further embodiment, the settings for programming the test signal selection hierarchy are correlated with the delays to be applied by the delay lines of the integrated circuit. Selecting a given set of internal signals for routing also selects one or more signaling pathways. Thus, the delays of each signaling pathway may be correlated with the delays of various internal operational signals. For example, a memory of the integrated circuit may include information correlating internal operational signals to programmed settings for the test signal selection hierarchy. The determined delays may then be stored within such a memory and associated with the various signals and/or signaling pathways.

With the delay for each signaling pathway determined, the control unit may store the determined delays in memory (e.g., one or more registers). An appropriate number of delay lines of the integrated circuit may then be programmed based upon the known delays in order to ensure that selected internal operational signals are provided to a testing element without skew. Thus, a designer may proceed to start acquiring internal operational signals from the test signal selection hierarchy.

Step 316 comprises delaying application of a subset of the received internal operational signals to a testing element by a programmed delay amount. Thus, a control unit of the integrated circuit may apply a different delay to each set of internal operational signals associated with a different clock signal. For example, consider a situation wherein a first clock signal has no relative delay, a second clock signal has a relative delay of two nanoseconds, and a third clock signal has a relative delay of five nanoseconds. To synchronize the application of the internal operational signals to the testing element, one or more programmable delay lines may be used to delay signals associated with the first clock signal by five nanoseconds, to delay signals associated with the second clock signal by three nanoseconds, and to refrain from delaying signals associated with the third clock signal. In this manner, as all signals applied to the testing element have the same amount of delay (e.g., five nanoseconds), they are all applied to the testing element such that they are all synchronized with respect to each other.

While the invention has been illustrated and described in the drawings and foregoing description, such illustration and description is to be considered as exemplary and not restrictive in character. One embodiment of the invention and minor variants thereof have been shown and described. In particular, features shown and described as exemplary software or firmware embodiments may be equivalently implemented as customized logic circuits and vice versa. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. An integrated circuit comprising:
a functional block of circuitry operable to generate internal operational signals for performing designated functions, the block of circuitry comprising a test clock operable to generate clock signals;
a test signal selection hierarchy coupled with the block of circuitry, the test signal selection hierarchy operable to receive the internal operational signals and the clock signals and to selectively route the internal operational signals and the clock signals towards a testing element;
a control unit operable to receive the clock signals from the test signal selection hierarchy, operable to determine a delay between received clock signals routed via the different signaling pathways of the test signal selection hierarchy, and operable to associate each of the received clock signals with one or more of the internal operational signals; and
a delay line operable to receive one or more of the internal operational signals from the test signal selection hierarchy and to delay application of a subset of the received internal operational signals to the testing element by a programmed delay amount, the control unit further operable to program the delay line based upon the delay between the clock signals and based upon the subset of the received internal operational signals.

2. The integrated circuit of claim 1 wherein:
the control unit is further operable, for each of the received clock signals, to associate the received clock signal with a set of the received internal operational signals that have been routed via a same signaling pathway of the test signal selection hierarchy as the clock signal.

3. The integrated circuit of claim 1 wherein:
the clock signals are applied synchronously as inputs to MUXs of the test signal selection hierarchy that directly receive the internal operational signals from the block of circuitry.

4. The integrated circuit of claim 1 further comprising:
the testing element, wherein the testing element comprises one or more General Purpose Input/Output (GPIO) pins.

5. The integrated circuit of claim 1 further comprising:
the testing element, wherein the testing element comprises a logic analyzer.

6. The integrated circuit of claim 1 wherein:
the programmed delay amount is applied to compensate for varying delays between the received internal operational signals encountered during routing via the signaling pathways of the test signal selection hierarchy.

7. The integrated circuit of claim 1 wherein:
the control unit is further operable to program registers of the test signal selection hierarchy to select the internal operational signals for routing to the testing element.

8. An integrated circuit comprising:
functional blocks of circuitry, each of the blocks of circuitry operable to generate internal operational signals for performing designated functions, each of the blocks of circuitry comprising a test clock operable to generate a clock signal and operable to synchronize generation of the clock signal with a clock signal of a test clock of another of the blocks of circuitry;
a test signal selection hierarchy coupled with the blocks of circuitry, the test signal selection hierarchy operable to receive the internal operational signals and the clock signals and to selectively route the internal operational signals and the clock signals to a testing element;
a control unit operable to receive the clock signals from the test signal selection hierarchy, operable to determine a delay between received clock signals routed via the different signaling pathways of the test signal selection hierarchy, and operable to associate each of the received clock signals with one or more internal operational signals; and
a delay line operable to receive one or more of the internal operational signals from the test signal selection hierarchy and to delay application of a subset of the received internal operational signals to the testing element by a programmed delay amount,
the control unit further operable to program the delay line based upon the delay between the clock signals and based upon the subset of the received internal operational signals.

9. The integrated circuit of claim 8 wherein:
the control unit is further operable, for each of the received clock signals, to associate the received clock signal with a set of the internal operational signals that have been routed via a same signaling pathway of the test signal selection hierarchy as the clock signal.

10. The integrated circuit of claim 8 wherein:
the clock signals are applied synchronously as inputs to MUXs of the test signal selection hierarchy that directly receive the internal operational signals from the functional blocks of circuitry.

11. The integrated circuit of claim 8 further comprising:
the testing element, wherein the testing element comprises one or more General Purpose Input/Output (GPIO) pins.

12. The integrated circuit of claim 8 further comprising:
the testing element, wherein the testing element comprises a logic analyzer.

13. The integrated circuit of claim 8 wherein:

the programmed delay amount is applied to compensate for varying delays between the received internal operational signals encountered during routing via the signaling pathways of the test signal selection hierarchy.

14. The integrated circuit of claim 8 wherein:

the control unit is further operable to program registers of the test signal selection hierarchy to select the internal operational signals for routing to the testing element.

15. A method comprising:

generating internal operational signals for performing designated functions at blocks of circuitry of an integrated circuit;

generating, at each of the blocks of circuitry, a clock signal synchronously with a clock signal of a test clock of another of the blocks of circuitry;

receiving, via a test signal selection hierarchy, the internal operational signals and the clock signals;

selectively routing, via different signaling pathways of the test signal selection hierarchy, the internal operational signals and the clock signals towards a testing element;

receiving the clock signals from the test signal selection hierarchy;

determining a delay between the received clock signals routed via the different signaling pathways;

associating each of the received clock signals with one or more of the internal operational signals; and delaying application of a subset of the received internal operational signals to the testing element by a programmed delay amount based upon the delay between the clock signals and based upon the subset of the received internal operational signals.

16. The method of claim 15 further comprising:

for each of the received clock signals, associating the received clock signal with a set of the received internal operational signals that have been routed via a same signaling pathway of the test signal selection hierarchy as the clock signal.

17. The method of claim 15 wherein:

the clock signals are applied synchronously as inputs to MUXs of the test signal selection hierarchy that directly receive the internal operational signals from the functional blocks of circuitry.

18. The method of claim 15 wherein:

the testing element comprises one or more General Purpose Input/Output (GPIO) pins.

19. The method of claim 15 wherein:

the testing element comprises a logic analyzer.

20. The method of claim 15 further comprising:

programming the delay amount to compensate for varying delays between the received internal operational signals encountered during routing via the signaling pathways of the test signal selection hierarchy.

* * * * *